(12) United States Patent
Muchherla et al.

(10) Patent No.: US 12,051,479 B2
(45) Date of Patent: Jul. 30, 2024

(54) MEMORY BLOCK PROGRAMMING USING DEFECTIVITY INFORMATION

(71) Applicant: Micron Technology, Inc., Boise, ID (US)

(72) Inventors: Kishore Kumar Muchherla, Fremont, CA (US); Akira Goda, Tokyo (JP); Dave Scott Ebsen, Minnetonka, MN (US); Lakshmi Kalpana Vakati, San Jose, CA (US); Jiangli Zhu, San Jose, CA (US); Peter Feeley, Boise, ID (US); Sanjay Subbarao, Irvine, CA (US); Vivek Shivhare, Milpitas, CA (US); Fangfang Zhu, San Jose, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 191 days.

(21) Appl. No.: 17/872,567

(22) Filed: Jul. 25, 2022

(65) Prior Publication Data

US 2024/0029815 A1    Jan. 25, 2024

(51) Int. Cl.
  *G11C 29/52*    (2006.01)
  *G11C 29/02*    (2006.01)

(52) U.S. Cl.
  CPC ............ *G11C 29/52* (2013.01); *G11C 29/022* (2013.01)

(58) Field of Classification Search
  CPC ...... G11C 29/52; G11C 29/022; G11C 29/838
  See application file for complete search history.

(56) References Cited

U.S. PATENT DOCUMENTS

2013/0326312 A1\* 12/2013 Lee ..................... G06F 12/0246
                                                         714/773

\* cited by examiner

*Primary Examiner* — Han Yang
(74) *Attorney, Agent, or Firm* — NICHOLSON DE VOS WEBSTER & ELLIOTT LLP

(57) ABSTRACT

Methods, systems, and apparatuses include retrieving a defectivity footprint of a portion of memory, the portion of memory composed of multiple blocks. A deck programming order is determined, based on the defectivity footprint, for a current block of the multiple blocks. The current block is composed of multiple decks. The deck programming order is an order in which the multiple decks are programmed. The multiple decks programmed according to the determined deck programming order.

20 Claims, 7 Drawing Sheets

MEMORY BLOCK PROGRAMMING USING DEFECTIVITY INFORMATION

TECHNICAL FIELD

The present disclosure generally relates to memory block programming, and more specifically, relates to memory block programming using defectivity information.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
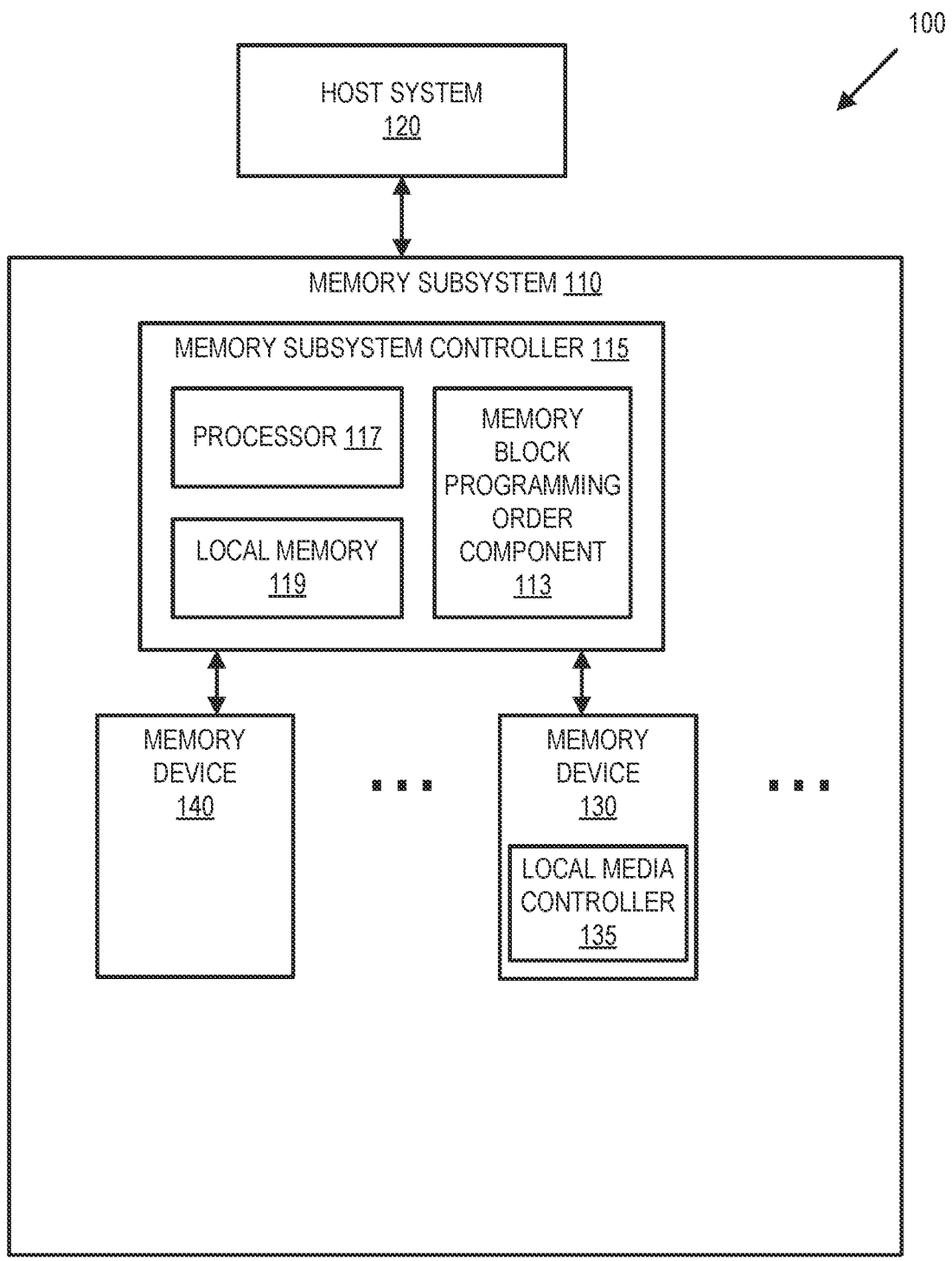
FIG. 1 illustrates an example computing system that includes a memory subsystem in accordance with some embodiments of the present disclosure.

Aspects of the present disclosure are directed to memory block programming using defectivity information in a memory subsystem. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dice. One example of non-volatile memory devices is a negative-and (NAND) memory device. Other examples of non-volatile memory devices are described below in conjunction with FIG. 1. The dice in the packages can be assigned to one or more channels for communicating with a memory subsystem controller. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit that stores information.

Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple-level cells (TLCs), and quad-level cells (QLCs). For example, a SLC can store one bit of information and has two logic states.

In conventional memory systems, there are defects introduced during manufacturing and during operation that may prevent a memory block from being properly programmed. When attempting to program a memory block containing defects, user data being written to the memory block can be lost when the programming fails. In order to preserve data, the user data being programmed into the memory block is held in a buffer while being programmed. For example, a buffer of four SLC blocks can be used when programming a QLC block to ensure no data loss due to defects. If there is not full coverage of the memory block to be programmed, a defect in the memory block could cause programming failure and an increase in uncorrectable bit error rate (UBER). For a QLC block that does not include defects, however, a buffer of four SLC blocks is excessive. There is, therefore, a tradeoff between UBER and overprovisioning to provide full buffer coverage of the memory block.

Aspects of the present disclosure address the above and other deficiencies by using known defectivity information of the memory system to program the areas of the memory with defects first. If a programming failure occurs in these areas, the affected user data can be recovered using less buffer space because less data of, e.g., a memory block has been subject to the programming operation at the time of failure. As a result, there is not an increase in UBER that would typically accompany a smaller buffer size. In other words, this memory block programming scheme minimizes the buffer space and the corresponding overprovisioning penalty while still providing adequate defectivity coverage.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or operations from the host system 120 and can convert the commands or operations into instructions or appropriate commands to achieve the desired access to the memory devices 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes a memory block programming order component 113 that programs memory blocks using defectivity information. In some embodiments, the controller 115 includes at least a portion of the memory block programming order component 113. For example, the controller 115 can include a processor 117 (processing device) configured to execute instructions stored in local memory 119 for performing the operations described herein. In some embodiments, a memory block programming order component 113 is part of the host system 110, an application, or an operating system.

The memory block programming order component 113 can use defectivity information to program subcomponents of a memory block in an efficient order to reduce bit error problems while using minimal buffer space. Further details with regards to the operations of the memory block programming order component 113 are described below.

Figure 2:
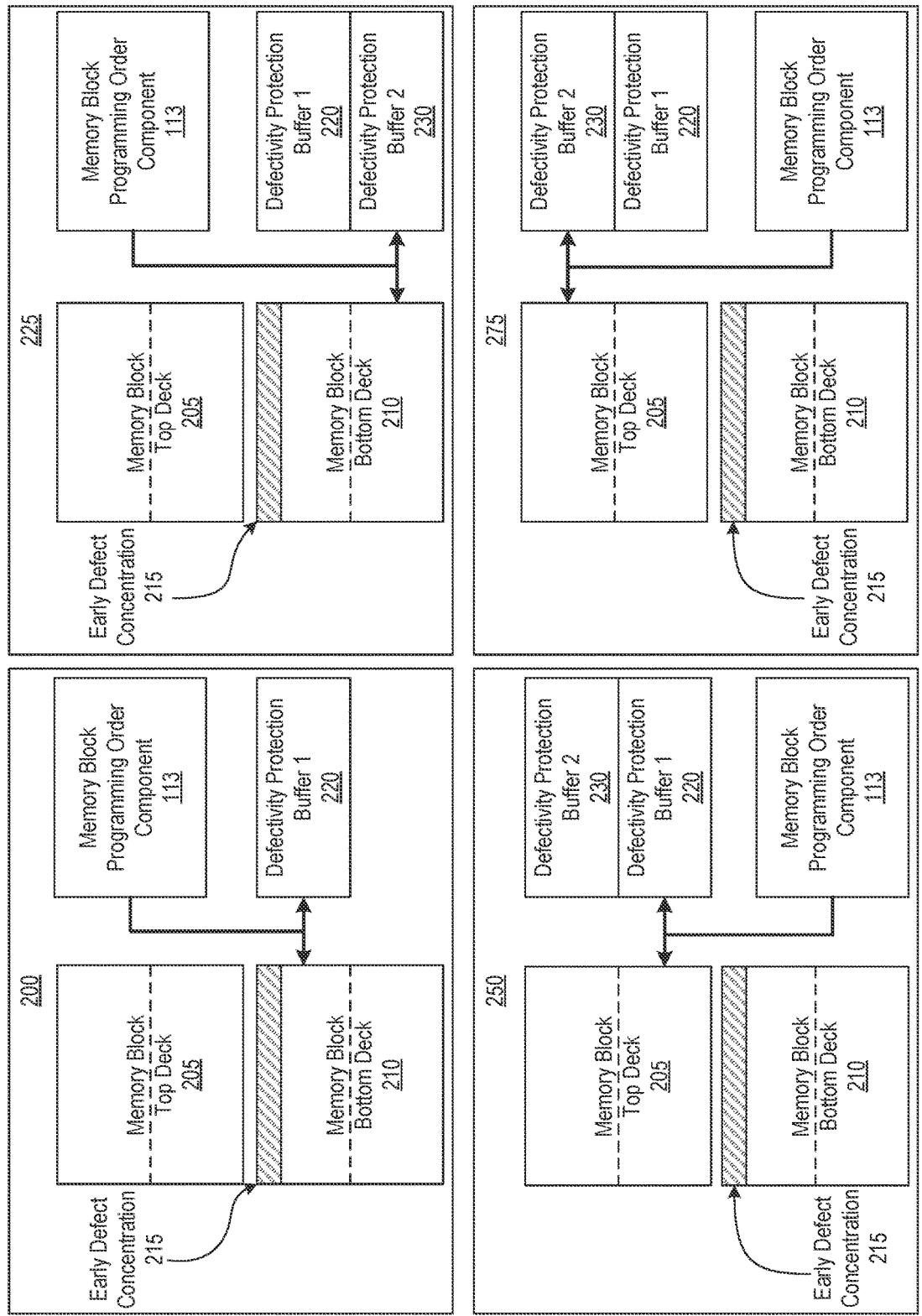
FIG. 2 illustrates memory block programming using defectivity information in accordance with some embodiments of the present disclosure.

FIG. 2 illustrates memory block programming using defectivity information in accordance with some embodiments of the present disclosure. The illustrated memory block programming can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. As shown in FIG. 2, the illustrated memory block programming is performed by the memory block programming order component 113. Although not illustrated, in some embodiments, the illustrated memory block programming is performed by the processor 117 of FIG. 1. In other embodiments, some parts of the illustrated memory block programming are performed by memory block programming order component 113 and other parts are performed by the processor 117. The illustrated embodiments should be understood only as examples, and the illustrated memory block programming can be performed in a different order and/or some memory block programming can be performed in parallel. Additionally, one or more steps can be omitted in various embodiments. Thus, not all steps are required in every embodiment. Other flows are possible.

As shown in FIG. 2, a memory subsystem, such as memory subsystem 110 of FIG. 1, is programming a memory block with early defect concentration 215. This memory block contains a memory block top deck 205 and a memory block bottom deck 210. In some embodiments, the memory block is composed of QLCs and each of memory block top deck 205 and memory block bottom deck 210 are halves of the overall memory block. In such embodiments, each of memory block top deck 205 and memory block bottom deck 210 holds an amount of data equivalent to half of a QLC block (e.g., the amount of data held in an MLC block).

In other embodiments, the memory block is composed of another cell type, such as MLCs or TLCs, and each of memory block top deck 205 and memory block bottom deck 210 are halves or other subdivisions of the overall memory block. In these embodiments, each of the decks therefore holds an amount of data equivalent to the corresponding portion of the overall MLC or TLC block. For example, the memory block is composed of TLCs and each deck is a third of the overall memory block. Each of the decks therefore holds data equivalent to a third of the TLC block (e.g., the amount of data held in an SLC block). In an alternative example, the memory block is composed of MLCs and each deck is half of the overall memory block. Each of the decks therefore holds data equivalent to half of the MLC block (e.g., the amount of data held in an SLC block).

In some embodiments, although only two decks, memory block top deck 205 and memory block bottom deck 210, are illustrated, the memory block can be divided into more than two decks. For the purposes of this disclosure, the term deck refers to a subdivision of a memory block that can be independently programmed or erased. Therefore, the higher the number of decks in a memory block, the greater the flexibility to determine an area with the highest probability of programming failure. A deck may not be the smallest subdivision of a memory block and the deck may also contain subdivisions within itself.

As shown in FIG. 2, the first portion of memory block bottom deck 210 holds an amount of data equivalent to half of memory block bottom deck 210 (e.g., the amount of data held in an SLC block). Defectivity protection buffer 1 220 is a memory block composed of SLCs such that the user data held in defectivity protection buffer 1 220 is also stored one-to-one in the first portion of memory block bottom deck 210.

In some embodiments, defectivity protection buffer 1 220 and defectivity protection buffer 2 230 are blocks composed of SLCs. In other embodiments, defectivity protection buffer 1 220 and defectivity protection buffer 2 230 are of another cell type of lesser bit density than the cell type of memory block top deck 205 and memory block bottom deck 210. Defectivity protection buffer 1 220 and defectivity protection buffer 2 230 are a cell/memory type with high reliability and low potential for errors.

In some embodiments, defectivity protection buffer 1 220 and defectivity protection buffer 2 230 are part of a local memory of a memory subsystem, such as local memory 119 of FIG. 1. In other embodiments, defectivity protection buffer 1 220 and defectivity protection buffer 2 230 are part of memory block programming order component 113.

The memory subsystem receives one or more commands from a host system, such as host system 120 of FIG. 1, to program user data to memory. In some embodiments, in response to receiving these commands, the memory subsystem controller, such as memory subsystem controller 115 of FIG. 1, sends commands to program the data to memory block top deck 205 and memory block bottom deck 210. Because memory block top deck 205 and memory block bottom deck 210 are independent decks, each of memory block top deck 205 and memory block bottom deck 210 can be programmed individually and in a direction from top to bottom or from bottom to top.

In some embodiments, memory block programming order component 113 determines an order in which to program memory block top deck 205 and memory block bottom deck 210. Subsequently, memory block programming order component 113 programs memory block top deck 205 and memory block bottom deck 210 in the determined order. For example, memory block programming order component 113 may determine that memory block bottom deck 210 will be programmed first based on early defect concentration 215. Memory block programming order component 113 therefore programs memory block bottom deck 210 followed by memory block top deck 205.

As shown in FIG. 2, memory block bottom deck 210 includes early defect concentration 215. The terms defect and defectivity, as used throughout the disclosure, refer to deviations from the standard operation of a device. More specifically, defects, in the context of memory devices, such as memory device 130 or 140 of FIG. 1, or in the context of memory blocks, such as the memory block made of memory block top deck 205 and memory block bottom deck 210, may refer to regions of memory where the fabrication material was not properly deposited. Defects may also include regions of memory with break down in insulation between various components, leading to failure during operation. Defects may also include unintended open circuits in regions of memory. These defects may be present at manufacturing, such as the improper deposits, or may manifest during operation, such as electric fields breaking down the insulation between components.

In programming phase 200, memory block programming order component 113 retrieves a defectivity footprint for the memory device including defectivity information relating to memory block top deck 205 and memory block bottom deck 210. The defectivity footprint is generated during manufacturing of the memory device (such as memory device 130 or 140 of FIG. 1) which includes memory block top deck 205 and memory block bottom deck 210. The defectivity footprint includes information about locations of defects that occurred during manufacturing (e.g., each defect concentration can include early defects, late defects, or a combination of the two) and the severity of the defects. As used throughout the specification, an early defect refers to a defect near the top of a memory block deck and a late defect refers to a defect near the bottom of a memory block deck. In some embodiments, the severity of the defects corresponds to a measure of the likelihood that a defect will cause failure during programming.

Memory block programming order component 113 uses defectivity information from the defectivity footprint to determine that early defect concentration 215 is at the top of memory block bottom deck 210. For example, memory block programming order component 113 uses a lookup table or similar method to find defectivity information relating to memory block top deck 205 and memory block bottom deck 210 in the defectivity footprint. For the purposes of illustrating an example, the top side of memory block bottom deck 210 refers to the side of memory block bottom deck 210 between memory block top deck 205 and memory block bottom deck 210. Similarly, the bottom side of memory block bottom deck 210 refers to the side of memory block bottom deck 210 opposite memory block top deck 205.

This defectivity information indicates that early defect concentration 215 is located on the top side of memory block bottom deck 210. In some embodiments, the defectivity information is information indicating a likelihood of failure during programming corresponding to each wordline of a memory device, such as memory device 130 or 140 of FIG. 1. In other embodiments, the defectivity information includes different levels of granularity. The level of granularity for the defectivity information differs depending on the available storage, operating conditions, and other parameters. In one embodiment, the level of granularity for the defectivity information is related to the deck size. For example, for a deck size of half of a QLC block, the level of granularity for the defectivity information can be half of the deck size. With this level of granularity, memory block programming order component 113 can ensure that early defect concentration 215 is programmed first using the deck order and the programming direction for each deck.

In response to memory block programming order component 113 determining that early defect concentration 215 is at the top of memory block bottom deck 210, memory block programming order component 113 programs memory block bottom deck 210 first. In one embodiment, memory block programming order component 113 programs a first portion of memory block bottom deck 210, denoted by a dashed line, including early defect concentration 215 first. Memory block programming order component 113 loads the user data to be programmed to the first portion of memory block bottom deck 210 into defectivity protection buffer 1 220. In some embodiments, memory block programming order component 113 also loads the user data into defectivity protection buffer 2 230 (e.g., the user data to be programmed to the second portion of memory block bottom deck 210). While memory block programming order component 113 loads the user data into defectivity protection buffer 1 220, memory block programming order component 113 also programs the user data into the first portion of memory block bottom deck 210.

In some embodiments, memory block programming order component 113 determines the order of programming for the entire memory block, including memory block top deck 205 and memory block bottom deck 210 before programming the first portion of memory block bottom deck 210. In other embodiments, memory block programming order component 113 determines only that the first portion of memory block bottom deck 210 is programmed first.

As shown in programming phases 200 and 225 of FIG. 2, memory block programming order component 113 selects a programming direction for memory block bottom deck 210 using the location of early defect concentration 215. In some embodiments, although the entirety of each portion is illustrated as being programmed at once, each portion of memory block top deck 205 and memory block bottom deck 210 is programmed wordline by wordline according to the programming direction. Memory block programming order component 113 selects a programming direction that corresponds with the earliest possible programming of early defect concentration 215. For example, memory block programming order component 113 uses a programming direction of top to bottom for memory block bottom deck 210 because early defect concentration 215 is located on the top side of memory block bottom deck 210. If a failure occurs during programming of the first portion of memory block bottom deck 210, defectivity protection buffer 1 220 contains the user data, so there is no increase in the UBER of the memory subsystem.

In programming phase 225, memory block programming order component 113 programs memory block bottom deck 210 with user data stored in defectivity protection buffer 2 230. In some embodiments, memory block programming order component 113 uses defectivity information from the defectivity footprint retrieved in programming phase 200 to determine that the second portion of memory block bottom deck 210 has the next highest likelihood of programming failure. In other embodiments, the programming order is determined in programming phase 200. As shown in FIG. 2, the second portion of memory block bottom deck 210, notated by a dashed line, receives the user data from memory block programming order component 113 in programming phase 225.

In one embodiment, in response to memory block programming order component 113 determining that the second portion of memory block bottom deck 210 has the next highest likelihood of programming failure, memory block programming order component 113 programs the second portion of memory block bottom deck 210 next. In some embodiments, once early defect concentration 215 has been programmed, memory block programming order component 113 programs the rest of the memory block in a default order instead of based on the likelihood of programming failure.

If memory block programming order component 113 did not already load the user data into defectivity protection buffer 2 230 in programming phase 200, memory block programming order component 113 loads the user data into defectivity protection buffer 2 230. While memory block programming order component 113 loads the user data into defectivity protection buffer 2 230, memory block programming order component 113 also programs the user data into the second portion of memory block bottom deck 210.

In some embodiments, the second portion of memory block bottom deck 210 holds an amount of data equivalent to half of memory block bottom deck 210 and comparable to the amount of data held by an SLC block. Defectivity protection buffer 2 230 is a memory block composed of SLCs such that the user data held in defectivity protection buffer 2 230 is stored one-to-one in the second portion of memory block bottom deck 210.

As shown in programming phase 225 of FIG. 2, memory block programming order component 113 uses the same programming direction for memory block bottom deck 210 from programming phase 200. Memory block programming order component 113 attempts to program the second portion of memory block bottom deck 210 starting with the wordlines directly below the last wordlines covered by defectivity protection buffer 1 220. If a failure occurs during programming of the second portion of memory block bottom deck 210, defectivity protection buffer 1 220 contains the user data for the first portion of memory block bottom deck 210 and defectivity protection buffer 2 230 contains the user data for the second portion of memory block bottom deck 210 so that there is no change in the UBER of the memory subsystem due to the programming failure.

In programming phase 250, memory block programming order component 113 clears defectivity protection buffer 1 220, removing the data stored from programming the first portion of memory block bottom deck 210 in programming phase 200. In some embodiments, memory block programming order component 113 also clears defectivity protection buffer 2 230, removing the data stored from programming the second portion of memory block bottom deck 210 in programming phase 225. In some embodiments, memory block programming order component 113 clears defectivity protection buffer 1 220 and defectivity protection buffer 2 230 in response to programming the second portion of memory block bottom deck 210. Memory block programming order component 113 loads the next set of user data into defectivity protection buffer 1 220. In some embodiments, memory block programming order component 113 also loads the user data into defectivity protection buffer 2 230. In response to loading the user data into defectivity protection buffer 1 220, memory block programming order component 113 programs the user data into the first portion of memory block top deck 205.

In some embodiments, in response to a programming failure during programming phase 200 or 225, memory block programming order component 113 stops programming the user data into the memory block. Memory block programming order component 113 can also send an indication to a memory subsystem controller, such as memory subsystem controller 115 of FIG. 1, or to a host system, such as host system 120 of FIG. 1. This indication communicates that programming has failed and can further communicate a deck or even a wordline where the programming failed.

In programming phase 250, in some embodiments, memory block programming order component 113 uses defectivity information from the defectivity footprint retrieved in programming phase 200 to determine that the first portion of memory block top deck 205 has the next highest likelihood of programming failure. In other embodiments, the programming order is determined in programming phase 200. As shown in FIG. 2, the first portion of memory block top deck 205, notated by a dashed line, receives the user data from memory block programming order component 113 in programming phase 250.

In response to memory block programming order component 113 determining that the first portion of memory block top deck 205 has the next highest likelihood of programming failure, memory block programming order component 113 programs the first portion of memory block top deck 205. In some embodiments, once early defect concentration 215 has been programmed, the rest of the memory block is programmed in a default order instead of based on the likelihood of programming failure.

In programming phase 275, memory block programming order component 113 programs memory block top deck 205 with user data stored in defectivity protection buffer 2 230. For example, memory block programming order component 113 programs the second portion of memory block top deck 205. As shown in FIG. 2, the second portion of memory block top deck 205, notated by a dashed line, receives the user data from memory block programming order component 113 in programming phase 275.

In response to memory block programming order component 113 determining that the second portion of memory block top deck 205 is the last unprogrammed portion of the memory block remaining, memory block programming order component 113 programs the second portion of memory block top deck 205 next. In some embodiments, once early defect concentration 215 has been programmed, memory block programming order component 113 programs the rest of the memory block in a default order instead of based on the likelihood of programming failure.

In some embodiments, in response to successfully programming memory block bottom deck 210, memory block programming order component 113 clears defectivity protection buffer 2 230, removing the data stored from programming the second portion of memory block bottom deck 210 in programming phase 225. In some embodiments, memory block programming order component 113 loads the user data into defectivity protection buffer 2 230 in programming phase 275. In other embodiments, memory block programming order component 113 loads the user data into defectivity protection buffer 2 230 in programming phase 250. While memory block programming order component 113 loads the user data into defectivity protection buffer 2 230, memory block programming order component 113 also programs the user data into the second portion of memory block top deck 205.

As shown in programming phase 275, memory block programming order component 113 uses the same programming direction for memory block top deck 205 from 250. Memory block programming order component 113 attempts to program the second portion of memory block top deck 205 starting with the wordlines directly above the last wordlines covered by defectivity protection buffer 1 220. Because the portions of the memory block with the highest likelihood of failures have already been successfully programmed, namely early defect concentration 215, it is unlikely that a program failure will occur during programming of the second portion of memory block top deck 205. Memory block programming order component 113 then prepares to program the next memory block. For example, memory block programming order component 113 clears defectivity protection buffer 1 220 and defectivity protection buffer 2 230.

Figure 3:
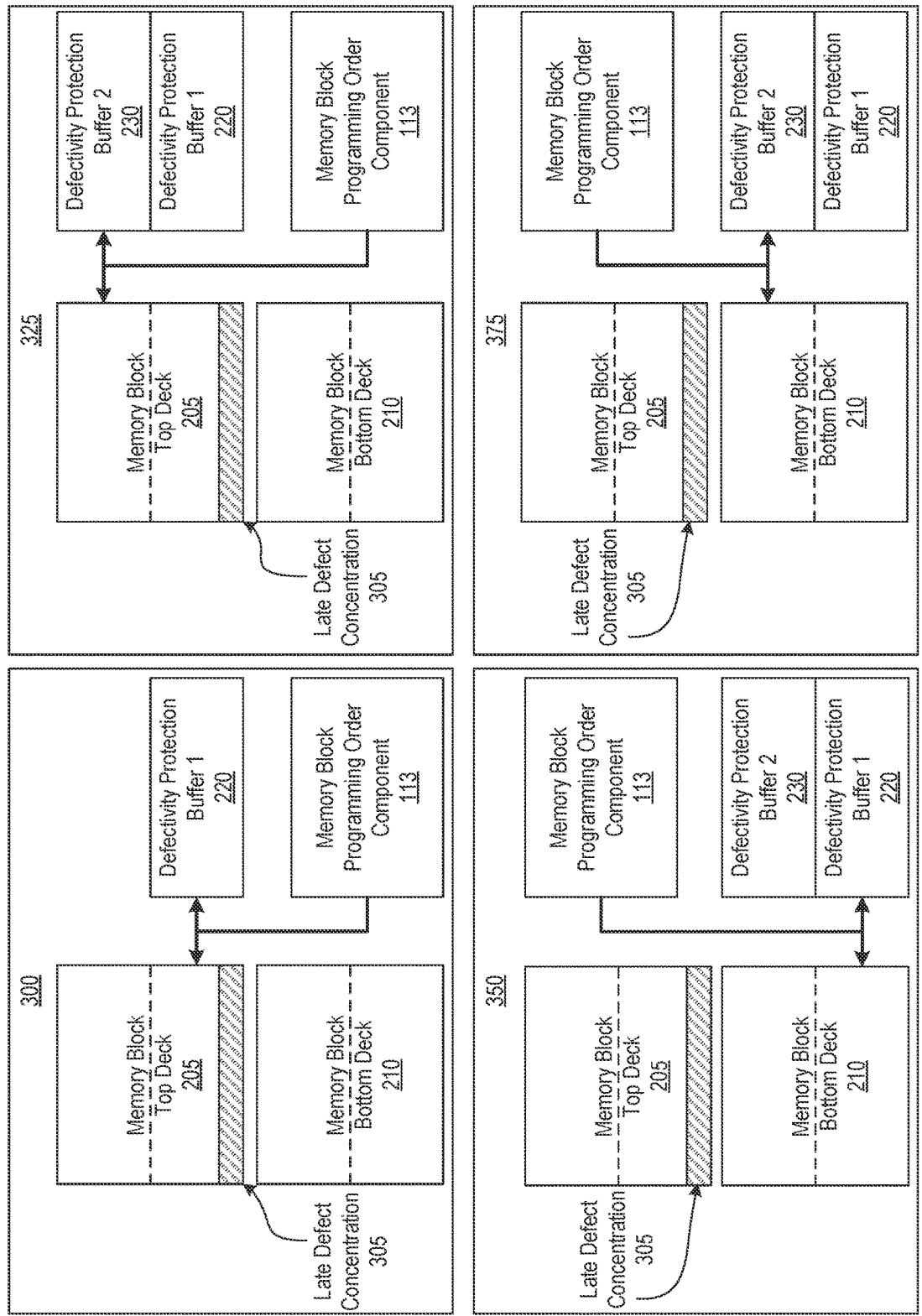
FIG. 3 illustrates memory block programming using defectivity information in accordance with some embodiments of the present disclosure.

FIG. 3 illustrates memory block programming using defectivity information in accordance with some embodiments of the present disclosure. The illustrated memory block programming can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. As shown in FIG. 3, the illustrated memory block programming is performed by the memory block programming order component 113. Although not illustrated, in some embodiments, the illustrated memory block programming is performed by the processor 117 of FIG. 1. In other embodiments, some parts of the illustrated memory block programming are performed by memory block programming order component 113 and other parts are performed by the processor 117. The illustrated embodiments should be understood only as examples, and the illustrated memory block programming can be performed in a different order and/or some memory block programming can be performed in parallel. Additionally, one or more steps can be omitted in various embodiments. Thus, not all steps are required in every embodiment. Other flows are possible.

As shown in FIG. 3, memory block top deck 205 includes late defect concentration 305. In programming phase 300, memory block programming order component 113 retrieves a defectivity footprint for the memory device including defectivity information relating to memory block top deck 205 and memory block bottom deck 210. The defectivity footprint is generated during manufacturing of the memory device (such as memory device 130 or 140 of FIG. 1) which includes memory block top deck 205 and memory block bottom deck 210. The defectivity footprint includes information about locations of defects that occurred during manufacturing (e.g., each defect concentration can include early defects, late defects, or a combination of the two) and the severity of the defects. In some embodiments, the severity of the defects corresponds to a measure of the likelihood that a defect will cause failure during programming.

Memory block programming order component 113 uses defectivity information from the defectivity footprint to determine that late defect concentration 305 is at the bottom of memory block top deck 205. For example, memory block programming order component 113 uses a lookup table or similar method to find defectivity information relating to memory block top deck 205 and memory block bottom deck 210 in the defectivity footprint.

This defectivity information indicates that late defect concentration 305 is located on the bottom side of memory block top deck 205. In some embodiments, the defectivity information is information indicating a likelihood of failure during programming corresponding to each wordline of a memory device, such as memory device 130 or 140 of FIG. 1. In other embodiments, the defectivity information includes different levels of granularity. The level of granularity for the defectivity information differs depending on the available storage, operating conditions, and other parameters. In one embodiment, the level of granularity for the defectivity information is related to the deck size. For example, for a deck size of half of a QLC block, the level of granularity for the defectivity information can be half of the deck size. With this level of granularity, memory block programming order component 113 can ensure that late defect concentration 305 is programmed first using the deck order and the programming direction for each deck.

In response to memory block programming order component 113 determining that late defect concentration 305 is at the bottom of memory block top deck 205, memory block programming order component 113 programs memory block top deck 205 first. In one embodiment, memory block programming order component 113 programs a first portion of memory block top deck 205, denoted by a dashed line, including late defect concentration 305 first. Memory block programming order component 113 loads the user data to be programmed to the first portion of memory block top deck 205 into defectivity protection buffer 1 220. In some embodiments, memory block programming order component 113 also loads the user data into defectivity protection buffer 2 230 (e.g., the user data to be programmed to the second portion of memory block top deck 205). While memory block programming order component 113 loads the user data into defectivity protection buffer 1 220, memory block programming order component 113 also programs the user data into the first portion of memory block top deck 205.

In some embodiments, memory block programming order component 113 determines the order of programming for the entire memory block, including memory block top deck 205 and memory block bottom deck 210 before programming the first portion of memory block top deck 205. In other embodiments, memory block programming order component 113 determines only that the first portion of memory block top deck 205 is programmed first.

As shown in programming phases 300 and 325 of FIG. 3, memory block programming order component 113 selects a programming direction for memory block top deck 205 using the location of late defect concentration 305. In some embodiments, although the entirety of each portion is illustrated as being programmed at once, each portion of memory block top deck 205 and memory block bottom deck 210 is programmed wordline by wordline according to the programming direction. Memory block programming order component 113 selects a programming direction that corresponds with the earliest possible programming of late defect concentration 305. For example, memory block programming order component 113 uses a programming direction of bottom to top for memory block top deck 205 because late defect concentration 305 is located on the bottom side of memory block top deck 205. If a failure occurs during programming of the first portion of memory block top deck 205, defectivity protection buffer 1 220 contains the user data, so there is no increase in the UBER of the memory subsystem.

In programming phase 325, memory block programming order component 113 programs memory block top deck 205 with user data stored in defectivity protection buffer 2 230. In some embodiments, memory block programming order component 113 uses defectivity information from the defectivity footprint retrieved in programming phase 300 to determine that the second portion of memory block top deck 205 has the next highest likelihood of programming failure. In other embodiments, the programming order is determined in programming phase 300. As shown in FIG. 3, the second portion of memory block top deck 205, notated by a dashed line, receives the user data from memory block programming order component 113 in programming phase 325.

In one embodiment, in response to memory block programming order component 113 determining that the second portion of memory block top deck 205 has the next highest likelihood of programming failure, memory block programming order component 113 programs the second portion of memory block top deck 205 next. In some embodiments, once late defect concentration 305 has been programmed, memory block programming order component 113 programs the rest of the memory block in a default order instead of based on the likelihood of programming failure.

If memory block programming order component 113 did not already load the user data into defectivity protection buffer 2 230 in programming phase 300, memory block programming order component 113 loads the user data into defectivity protection buffer 2 230. While memory block programming order component 113 loads the user data into defectivity protection buffer 2 230, memory block programming order component 113 also programs the user data into the second portion of memory block top deck 205.

In some embodiments, the second portion of memory block top deck 205 holds an amount of data equivalent to half of memory block top deck 205 and comparable to the amount of data held by an SLC block. Defectivity protection buffer 2 230 is a memory block composed of SLCs such that the user data held in defectivity protection buffer 2 230 is stored one-to-one in the second portion of memory block top deck 205.

As shown in programming phase 325 of FIG. 3, memory block programming order component 113 uses the same programming direction for memory block top deck 205 from programming phase 300. Memory block programming order component 113 attempts to program the second portion of memory block top deck 205 starting with the wordlines directly above the last wordlines covered by defectivity protection buffer 1 220. If a failure occurs during programming of the second portion of memory block top deck 205, defectivity protection buffer 1 220 contains the user data for the first portion of memory block top deck 205 and defectivity protection buffer 2 230 contains the user data for the second portion of memory block top deck 205 so that there is no change in the UBER of the memory subsystem due to the programming failure.

In programming phase 350, memory block programming order component 113 clears defectivity protection buffer 1 220, removing the data stored from programming the first portion of memory block top deck 205 in 300. In some embodiments, memory block programming order component 113 also clears defectivity protection buffer 2 230, removing the data stored from programming the second portion of memory block top deck 205 in programming phase 325. In some embodiments, memory block programming order component 113 clears defectivity protection buffer 1 220 and defectivity protection buffer 2 230 in response to programming the second portion of memory block top deck 205. Memory block programming order component 113 loads the next set of user data into defectivity protection buffer 1 220. In some embodiments, memory block programming order component 113 also loads the user data into defectivity protection buffer 2 230. In response to loading the user data into defectivity protection buffer 1 220, memory block programming order component 113 programs the user data into the first portion of memory block bottom deck 210.

In some embodiments, in response to a programming failure during programming phase 300 or 325, memory block programming order component 113 stops programming the user data into the memory block. Memory block programming order component 113 can also send an indication to a memory subsystem controller, such as memory subsystem controller 115 of FIG. 1, or to a host system, such as host system 120 of FIG. 1. This indication communicates that programming has failed and can further communicate a deck or even a wordline where the programming failed.

In programming phase 350, in some embodiments, memory block programming order component 113 uses defectivity information from the defectivity footprint retrieved in programming phase 300 to determine that the first portion of memory block bottom deck 210 has the next highest likelihood of programming failure. In other embodiments, the programming order is determined in programming phase 300. As shown in FIG. 3, the first portion of memory block bottom deck 210, notated by a dashed line, receives the user data from memory block programming order component 113 in programming phase 350.

In response to memory block programming order component 113 determining that the first portion of memory block bottom deck 210 has the next highest likelihood of programming failure, memory block programming order component 113 programs the first portion of memory block bottom deck 210. In some embodiments, once late defect concentration 305 has been programmed, the rest of the memory block is programmed in a default order instead of based on the likelihood of programming failure.

In programming phase 375, memory block programming order component 113 programs memory block bottom deck 210 with user data stored in defectivity protection buffer 2 230. For example, memory block programming order component 113 programs the second portion of memory block bottom deck 210. As shown in FIG. 3, the second portion of memory block bottom deck 210, notated by a dashed line, receives the user data from memory block programming order component 113 in programming phase 375.

In response to memory block programming order component 113 determining that the second portion of memory block bottom deck 210 is the last unprogrammed portion of the memory block remaining, memory block programming order component 113 programs the second portion of memory block bottom deck 210 next. In some embodiments, once late defect concentration 305 has been programmed, memory block programming order component 113 programs the rest of the memory block in a default order instead of based on the likelihood of programming failure.

In some embodiments, in response to successfully programming memory block top deck 205, memory block programming order component 113 clears defectivity protection buffer 2 230, removing the data stored from programming the second portion of memory block top deck 205 in programming phase 325. In some embodiments, memory block programming order component 113 loads the user data into defectivity protection buffer 2 230 in programming phase 375. In other embodiments, memory block programming order component 113 loads the user data into defectivity protection buffer 2 230 in programming phase 350. While memory block programming order component 113 loads the user data into defectivity protection buffer 2 230, memory block programming order component 113 also programs the user data into the second portion of memory block bottom deck 210.

As shown in programming phase 375, memory block programming order component 113 uses the same programming direction for memory block bottom deck 210 from 350. Memory block programming order component 113 attempts to program the second portion of memory block bottom deck 210 starting with the wordlines directly above the last wordlines covered by defectivity protection buffer 1 220. Because the portions of the memory block with the highest likelihood of failures have already been successfully programmed, namely late defect concentration 305, it is unlikely that a program failure will occur during programming of the second portion of memory block bottom deck 210. Memory block programming order component 113 then prepares to program the next memory block. For example, memory block programming order component 113 clears defectivity protection buffer 1 220 and defectivity protection buffer 2 230.

Figure 4:
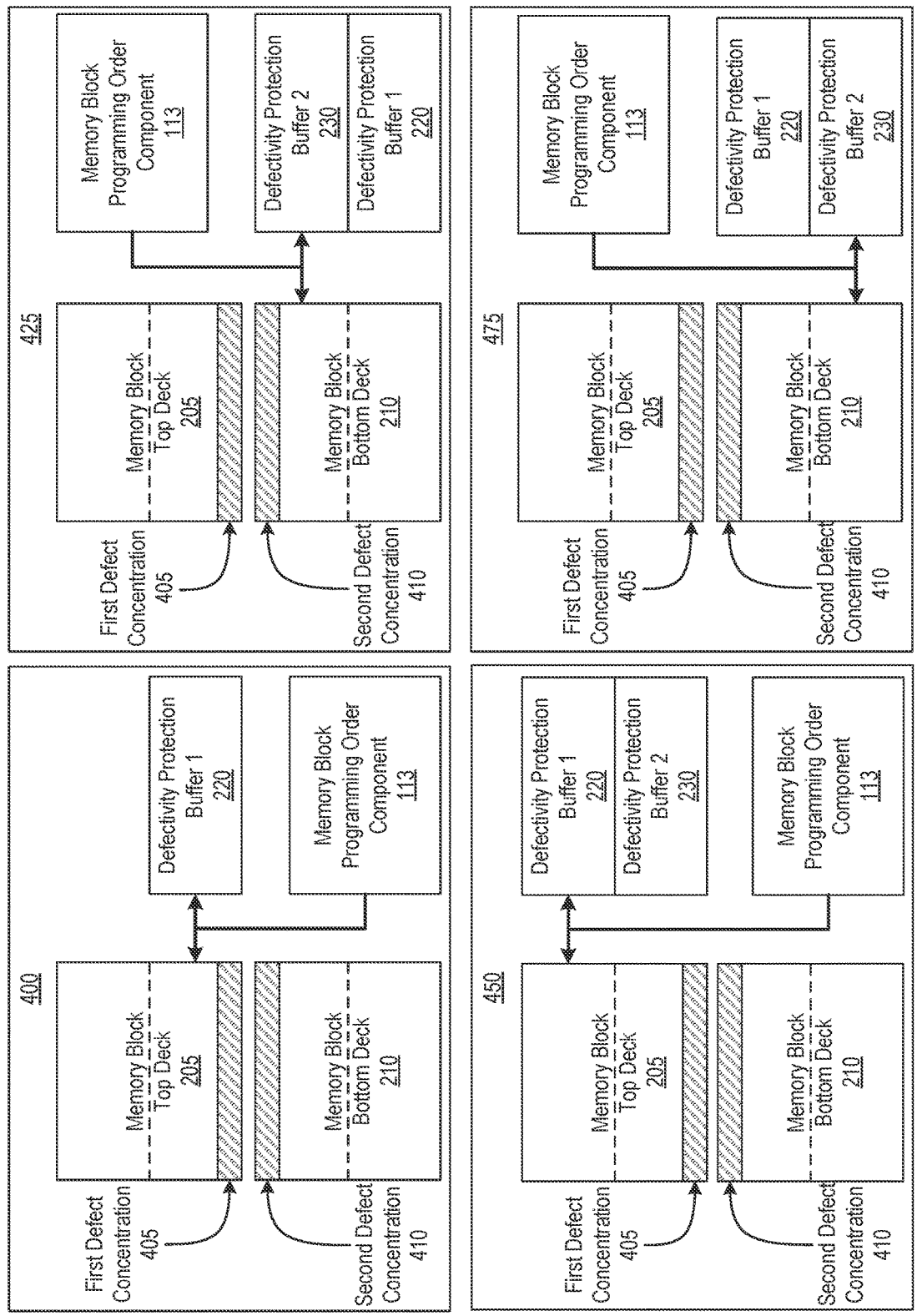
FIG. 4 illustrates memory block programming using defectivity information in accordance with some embodiments of the present disclosure.

FIG. 4 illustrates memory block programming using defectivity information in accordance with some embodiments of the present disclosure. The illustrated memory block programming can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. As shown in FIG. 4, the illustrated memory block programming is performed by the memory block programming order component 113. Although not illustrated, in some embodiments, the illustrated memory block programming is performed by the processor 117 of FIG. 1. In other embodiments, some parts of the illustrated memory block programming are performed by memory block programming order component 113 and other parts are performed by the processor 117. The illustrated embodiments should be understood only as examples, and the illustrated memory block programming can be performed in a different order and/or some memory block programming can be performed in parallel. Additionally, one or more steps can be omitted in various embodiments. Thus, not all steps are required in every embodiment. Other flows are possible.

As shown in FIG. 4, memory block top deck 205 includes first defect concentration 405 and second defect concentration 410. In programming phase 400, memory block programming order component 113 retrieves a defectivity footprint for the memory device including defectivity information relating to memory block top deck 205 and memory block bottom deck 210. The defectivity footprint is generated during manufacturing of the memory device (such as memory device 130 or 140 of FIG. 1) which includes memory block top deck 205 and memory block bottom deck 210. The defectivity footprint includes information about locations of defects that occurred during manufacturing (e.g., each defect concentration can include early defects, late defects, or a combination of the two) and the severity of the defects. In some embodiments, the severity of the defects corresponds to a measure of the likelihood that a defect will cause failure during programming.

Memory block programming order component 113 uses defectivity information from the defectivity footprint to determine that that first defect concentration 405 is at the bottom of memory block top deck 205 and that second defect concentration 410 is at the top of memory block bottom deck 210. For example, memory block programming order component 113 uses a lookup table or similar method to find defectivity information relating to memory block top deck 205 and memory block bottom deck 210 in the defectivity footprint. This defectivity information indicates that there is a first defect concentration 405 located on the bottom side of memory block top deck 205 and a second defect concentration 410 located on the top side of memory block bottom deck 210. The defectivity information also indicates that first defect concentration 405 is a higher priority. In some embodiments, determining the priority of first defect concentration 405 and second defect concentration 410 is based on the sizes of first defect concentration 405 and second defect concentration 410. In other embodiments, determining the priority of first defect concentration 405 and second defect concentration 410 is based on another metric, such as likelihood of programming failure or a combination of size and likelihood of programming failure.

In some embodiments, the defectivity information is information indicating a likelihood of failure during programming corresponding to each wordline of a memory device, such as memory device 130 or 140 of FIG. 1. In other embodiments, the defectivity information includes different levels of granularity. The level of granularity for the defectivity information differs depending on the available storage, operating conditions, and other parameters. In one embodiment, the level of granularity for the defectivity information is related to the deck size. For example, for a deck size of half of a QLC block, the level of granularity for the defectivity information can be half of the deck size. With this level of granularity, memory block programming order component 113 can ensure that first defect concentration 405 is programmed first and that second defect concentration 410 is programmed second using the deck order and the programming direction for each deck.

In response to memory block programming order component 113 determining that first defect concentration 405 located on the bottom side of memory block top deck 205, second defect concentration 410 located on the top side of memory block bottom deck 210, and first defect concentration 405 has a higher priority than second defect concentration 410, memory block programming order component 113 programs memory block top deck 205 first. In one embodiment, memory block programming order component 113 programs a first portion of memory block top deck 205, denoted by a dashed line, including first defect concentration 405 first. Memory block programming order component 113 loads the user data to be programmed to the first portion of memory block top deck 205 into defectivity protection buffer 1 220. In some embodiments, memory block programming order component 113 also loads the user data into defectivity protection buffer 2 230 (e.g., the user data to be programmed to the first portion of memory block bottom deck 210). While memory block programming order component 113 loads the user data into defectivity protection buffer 1 220, memory block programming order component 113 also programs the user data into the first portion of memory block top deck 205.

In some embodiments, memory block programming order component 113 determines the order of programming for the entire memory block, including memory block top deck 205 and memory block bottom deck 210 before programming the first portion of memory block top deck 205. In other embodiments, memory block programming order component 113 determines only that the first portion of memory block top deck 205 is programmed first.

As shown in programming phases 400 and 450 of FIG. 4, memory block programming order component 113 selects a programming direction for memory block top deck 205 using the location of first defect concentration 405. In some embodiments, although the entirety of each portion is illustrated as being programmed at once, each portion of memory block top deck 205 and memory block bottom deck 210 is programmed wordline by wordline according to the programming direction. Memory block programming order component 113 selects a programming direction that corresponds with the earliest possible programming of first defect concentration 405. For example, memory block programming order component 113 uses a programming direction of bottom to top for memory block top deck 205 because first defect concentration 405 is located on the bottom side of memory block top deck 205. If a failure occurs during programming of the first portion of memory block top deck 205, defectivity protection buffer 1 220 contains the user data, so there is no increase in the UBER of the memory subsystem.

In programming phase 425, memory block programming order component 113 programs memory block bottom deck 210 with user data stored in defectivity protection buffer 2 230. In some embodiments, memory block programming order component 113 uses defectivity information from the defectivity footprint retrieved in programming phase 400 to determine that the first portion of memory block bottom deck 210 has the next highest likelihood of programming failure due to second defect concentration 410. In other embodiments, the programming order is determined in programming phase 400. As shown in FIG. 4, the first portion of memory block bottom deck 210, notated by a dashed line, receives the user data from memory block programming order component 113 in programming phase 425.

In one embodiment, in response to memory block programming order component 113 determining that the first portion of memory block bottom deck 210 has the next highest likelihood of programming failure, memory block programming order component 113 programs the first portion of memory block bottom deck 210 next.

If memory block programming order component 113 did not already load the user data into defectivity protection buffer 2 230 in programming phase 400, memory block programming order component 113 loads the user data into defectivity protection buffer 2 230. While memory block programming order component 113 loads the user data into defectivity protection buffer 2 230, memory block programming order component 113 also programs the user data into the first portion of memory block bottom deck 210.

In some embodiments, the first portion of memory block bottom deck 210 holds an amount of data equivalent to half of memory block bottom deck 210 and comparable to the amount of data held by an SLC block. Defectivity protection buffer 2 230 is a memory block composed of SLCs such that the user data held in defectivity protection buffer 2 230 is stored one-to-one in the first portion of memory block bottom deck 210.

As shown in programming phase 425 of FIG. 4, memory block programming order component 113 selects a programming direction for memory block bottom deck 210 using the location of second defect concentration 410. In some embodiments, although the entirety of each portion is illustrated as being programmed at once, each portion of memory block top deck 205 and memory block bottom deck 210 is programmed wordline by wordline according to the programming direction. Memory block programming order component 113 selects a programming direction for memory block bottom deck 210 that corresponds with the earliest possible programming of second defect concentration 410. For example, memory block programming order component 113 uses a programming direction of top to bottom for memory block bottom deck 210 because second defect concentration 410 is located on the top side of memory block bottom deck 210. If a failure occurs during programming of the first portion of memory block bottom deck 210, defectivity protection buffer 1 220 contains the user data from the first portion of memory block top deck 205 and defectivity protection buffer 2 230 contains the user data from the first portion of memory block bottom deck 210, so there is no increase in the UBER of the memory subsystem.

In programming phase 450, memory block programming order component 113 clears defectivity protection buffer 1 220, removing the data stored from programming the first portion of memory block top deck 205 in 400. In some embodiments, memory block programming order component 113 also clears defectivity protection buffer 2 230, removing the data stored from programming the first portion of memory block bottom deck 210 in programming phase 425. In some embodiments, memory block programming order component 113 clears defectivity protection buffer 1 220 and defectivity protection buffer 2 230 in response to programming the first portion of memory block bottom deck 210. Memory block programming order component 113 loads the next set of user data into defectivity protection buffer 1 220. In some embodiments, memory block programming order component 113 also loads the user data into defectivity protection buffer 2 230. In response to loading the user data into defectivity protection buffer 1 220, memory block programming order component 113 programs the user data into the second portion of memory block top deck 210.

In some embodiments, in response to a programming failure during programming phase 400 or 425, memory block programming order component 113 stops programming the user data into the memory block. Memory block programming order component 113 can also send an indication to a memory subsystem controller, such as memory subsystem controller 115 of FIG. 1, or to a host system, such as host system 120 of FIG. 1. This indication communicates that programming has failed and can further communicate a deck or even a wordline where the programming failed.

In programming phase 450, in some embodiments, memory block programming order component 113 uses defectivity information from the defectivity footprint retrieved in programming phase 400 to determine that the second portion of memory block top deck 205 has the next highest likelihood of programming failure. In other embodiments, the programming order is determined in programming phase 400. As shown in FIG. 4, the second portion of memory block top deck 205, notated by a dashed line, receives the user data from memory block programming order component 113 in programming phase 450.

In response to memory block programming order component 113 determining that the second portion of memory block top deck 205 has the next highest likelihood of programming failure, memory block programming order component 113 programs the second portion of memory block top deck 205. In some embodiments, once first defect concentration 405 and second defect concentration 410 have been programmed, the rest of the memory block is programmed in a default order instead of based on the likelihood of programming failure.

As shown in programming phase 450 of FIG. 4, memory block programming order component 113 uses the same programming direction for memory block top deck 205 from programming phase 400. Memory block programming order component 113 attempts to program the second portion of memory block top deck 205 starting with the wordlines directly above the last wordlines covered by defectivity protection buffer 1 220. Because the portions of the memory block with the highest likelihood of failures have already been successfully programmed, namely first defect concentration 405 and second defect concentration 410, it is unlikely that a program failure will occur during programming of the second portion of memory block top deck 205.

In programming phase 475, memory block programming order component 113 programs memory block bottom deck 210 with user data stored in defectivity protection buffer 2 230. For example, memory block programming order component 113 programs the second portion of memory block bottom deck 210. As shown in FIG. 4, the second portion of memory block bottom deck 210, notated by a dashed line, receives the user data from memory block programming order component 113 in programming phase 475.

In response to memory block programming order component 113 determining that the second portion of memory block bottom deck 210 is the last unprogrammed portion of the memory block remaining, memory block programming order component 113 programs the second portion of memory block bottom deck 210 next. In some embodiments, once first defect concentration 405 and second defect concentration 410 have been programmed, memory block programming order component 113 programs the rest of the memory block in a default order instead of based on the likelihood of programming failure.

In some embodiments, in response to successfully programming the first of portion memory block bottom deck 210, memory block programming order component 113 clears defectivity protection buffer 2 230, removing the data stored from programming the first portion of memory block bottom deck 210 in programming phase 425. In some embodiments, memory block programming order component 113 loads the user data into defectivity protection buffer 2 230 in programming phase 475. In other embodiments, memory block programming order component 113 loads the user data into defectivity protection buffer 2 230 in programming phase 450. While memory block programming order component 113 loads the user data into defectivity protection buffer 2 230, memory block programming order component 113 also programs the user data into the second portion of memory block bottom deck 210.

As shown in programming phase 475, memory block programming order component 113 uses the same programming direction for memory block bottom deck 210 from 425. Memory block programming order component 113 attempts to program the second portion of memory block bottom deck 210 starting with the wordlines directly below the last wordlines covered by defectivity protection buffer 2 230. Because the portions of the memory block with the highest likelihood of failures have already been successfully programmed, namely first defect concentration 405 and second defect concentration 410, it is unlikely that a program failure will occur during programming of the second portion of memory block bottom deck 210. Memory block programming order component 113 then prepares to program the next memory block. For example, memory block programming order component 113 clears defectivity protection buffer 1 220 and defectivity protection buffer 2 230.

Figure 5:
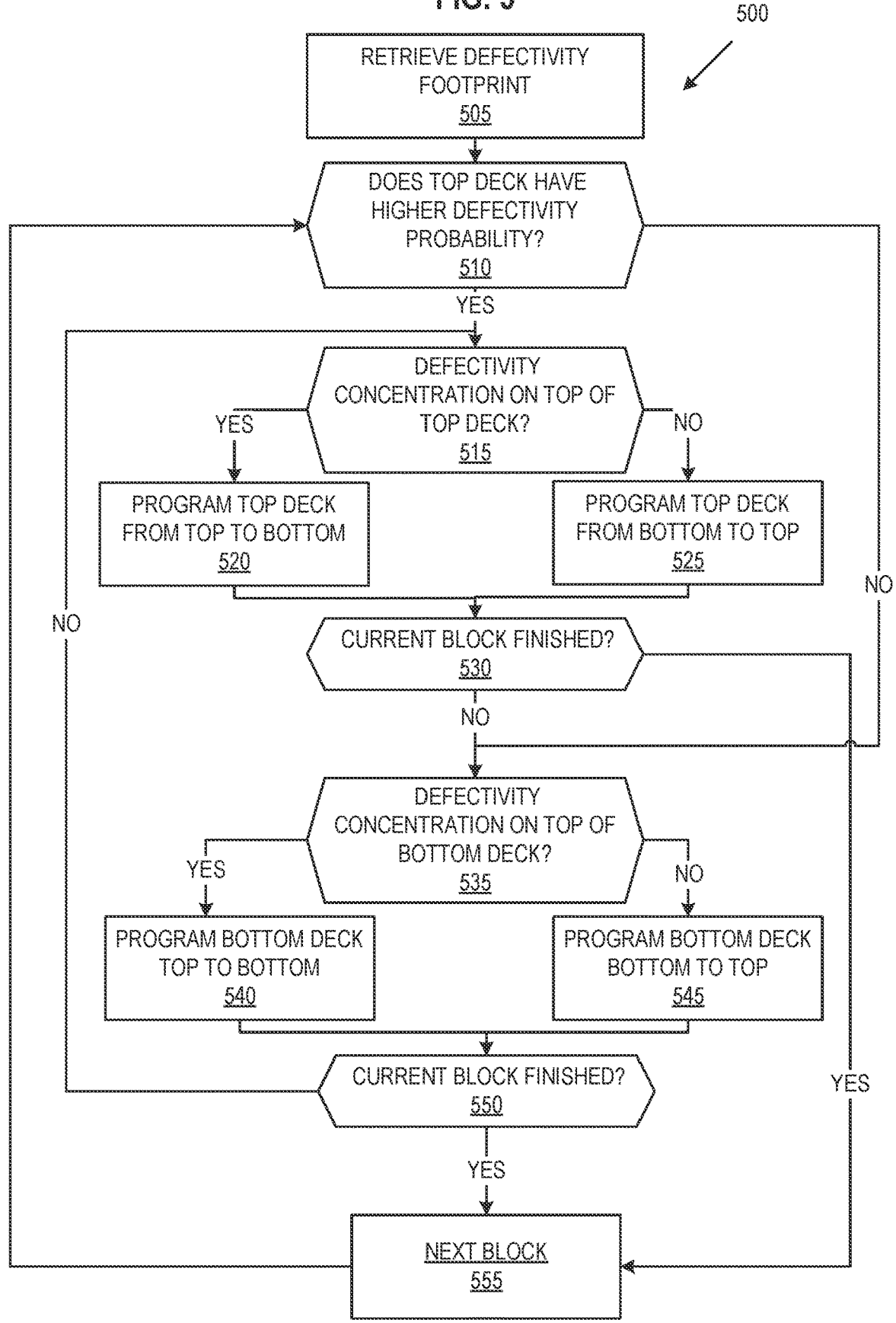
FIG. 5 is a flow diagram of an example method to program memory blocks using defectivity information in accordance with some embodiments of the present disclosure.

FIG. 5 is a flow diagram of an example method 500 to program memory blocks using defectivity information, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the memory block programming order component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 505, the processing device retrieves the defectivity footprint. For example, the processing device may retrieve a defectivity footprint stored in memory, such as local memory 119, memory device 140, or memory device 130 of FIG. 1. The defectivity footprint is based on known defects detected during and/or after manufacturing. In some embodiments, these manufacturing defects are detected by program status fails, program immediate scan fails, and other associated failures. In some embodiments, the defectivity footprint is continuously updated based on firmware logs. The firmware logs are associated with program status fails, program immediate scan fails, and other associated failures. In some embodiments, the program logs indicate whether a defect occurred and wordline information for where the defect occurred.

At operation 510, the processing device determines whether the top deck has a higher defect severity. For example, based on the defectivity footprint retrieved in operation 505, the processing device may determine whether a top deck of a memory block or a bottom deck of a memory block has a higher defect severity. If the processing device determines that the top deck has a higher defect severity, the processing device proceeds to operation 515. If, however, the processing device determines that the top deck does not have a higher defect severity, the processing device proceeds to operation 535.

In some embodiments, the defect severity is based on the number of wordlines in the deck with defects. In other embodiments, the defect severity is based on the severity of a defect. In some embodiments, the memory block is composed of QLCs and each of the top deck and the bottom deck are halves of the overall memory block. In such embodiments, each of the top deck and the bottom deck holds an amount of data equivalent to half of a QLC block (e.g., the amount of data held in an MLC block).

In other embodiments, the memory block is composed of another cell type, such as MLCs or TLCs, and each the top deck and the bottom deck are halves or other subdivisions of the overall memory block. In these embodiments, each of the decks therefore holds an amount of data equivalent to the corresponding portion of the overall MLC or TLC block. For example, the memory block is composed of TLCs and each deck is a third of the overall memory block. Each of the decks therefore holds data equivalent to a third of the TLC block (e.g., the amount of data held in an SLC block). In an alternative example, the memory block is composed of MLCs and each deck is half of the overall memory block. Each of the decks therefore holds data equivalent to half of the MLC block (e.g., the amount of data held in an SLC block).

In some embodiments, although operation 510 may imply that there are only two decks, top and bottom, the memory block can be divided into more than two decks. For the purposes of this disclosure, the term deck refers to a subdivision of a memory block that can be independently programmed or erased. Therefore, the higher the number of decks in a memory block, the greater the flexibility to determine an area with the highest probability of programming failure. A deck may not be the smallest subdivision of a memory block and the deck may also contain subdivisions within itself.

At operation 515, the processing device determines whether the defectivity concentration is located on the top of the top deck. For example, in response to determining that the top deck has a higher defect severity, the processing device may also determine where on the top deck the defect severity is highest. In some embodiments, this determination is based on how many wordlines contain defects and where on the top deck the defective wordlines are positioned. In some embodiments, this determination is also based on the severity of the defects. If the processing device determines that the defectivity concentration is on the top of the top deck, the processing device proceeds to operation 520. If, however, the processing device determines that the defectivity concentration is not on the top of the top deck, the processing device proceeds to operation 525.

At operation 520, the processing device programs the top deck from the top to the bottom. For example, in response to determining that the defectivity concentration is on the top of the top deck, the processing device programs the top deck beginning with the topmost wordline and programming in a downward direction.

At operation 525, the processing device programs the top deck from the bottom to the top. For example, in response to determining that the defectivity concentration is not on the top of the top deck, the processing device programs the top deck beginning with the bottommost wordline and programming in an upward direction.

At operation 530, the processing device determines whether the current block has been completely programmed. For example, the processing device determines whether all the decks of the current memory block have been programmed. If all the decks have been programmed, the processing device proceeds to operation 555.

At operation 535, the processing device determines whether the defectivity concentration is located on the top of the bottom deck. For example, in response to determining that the top deck does not have a higher defect severity, the processing device may also determine where on the bottom deck the defect severity is highest. In some embodiments, this determination is based on how many wordlines contain defects and where on the top deck the defective wordlines are positioned. In some embodiments, this determination is also based on the severity of the defects. If the processing device determines that the defectivity concentration is on the top of the bottom deck, the processing device proceeds to operation 540. If, however, the processing device determines that the defectivity concentration is not on the top of the top deck, the processing device proceeds to operation 545.

At operation 540, the processing device programs the bottom deck from the top to the bottom. For example, in response to determining that the defectivity concentration is on the top of the bottom deck, the processing device programs the bottom deck beginning with the topmost wordline and programming in a downward direction.

At operation 545, the processing device programs the bottom deck from the bottom to the top. For example, in response to determining that the defectivity concentration is not on the top of the bottom deck, the processing device programs the bottom deck beginning with the bottommost wordline and programming in an upward direction.

At operation 550, the processing device determines whether the current block has been completely programmed. For example, the processing device determines whether all the decks of the current memory block have been programmed. If all the decks have been programmed, the processing device proceeds to operation 555.

At operation 555, the processing device moves on to programming the next memory block. For example, the processing device may clear the buffer used to program the current block in preparation for the next block.

Figure 6:
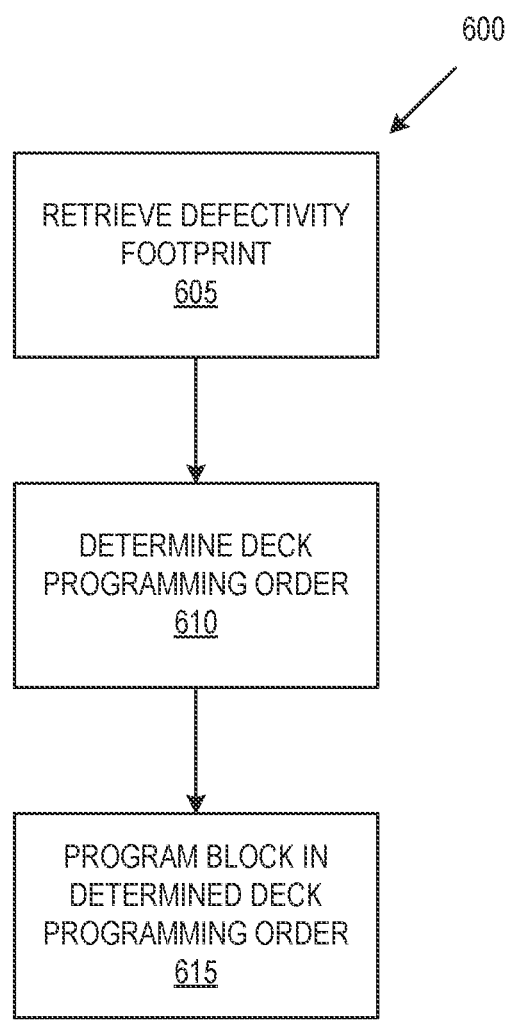
FIG. 6 is a flow diagram of an example method to program memory blocks using defectivity information in accordance with some embodiments of the present disclosure.

FIG. 6 is a flow diagram of an example method 600 to program memory blocks using defectivity information, in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the memory block programming order component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 605, the processing device retrieves the defectivity footprint. For example, the processing device may retrieve a defectivity footprint stored in memory, such as local memory 119, memory device 140, or memory device 130 of FIG. 1. The defectivity footprint is based on known defects detected during and/or after manufacturing. In some embodiments, these manufacturing defects are detected by program status fails, program immediate scan fails, and other associated failures. In some embodiments, the defectivity footprint is continuously updated based on firmware logs. The firmware logs are associated with program status fails, program immediate scan fails, and other associated failures. In some embodiments, the program logs indicate whether a defect occurred and wordline information for where the defect occurred.

At operation 610, the processing device determines the deck programming order. For example, the processing device determines how many decks are contained within the current block. In some embodiments, the current block is composed of a top deck and a bottom deck. In other embodiments, the current block has more than two different decks. After determining how many decks are contained, the processing device determines which decks should be programmed first based on the defectivity footprint retrieved in operation 605.

The defectivity footprint retrieved in 605 contains defectivity information relating to the decks within the current block. The processing device can use this defectivity information to determine which decks should be programmed first. For example, decks with higher concentrations of defects or more defects should be programmed first. In some embodiments, the deck programming order is in the form of a page map which indicates the order that the pages in the current block are programmed.

In some embodiments, the deck programming order also includes a deck programming direction. For example, each deck has a first wordline and a last wordline, defined for this disclosure as a top and a bottom. The processing device therefore determines whether each deck is programmed from the top to the bottom or vice versa.

At operation 615, the processing device programs the block according to the deck programming order. For example, the processing device loads user data into a buffer, such as defectivity protection buffers 1 and 2 220 and 230 of FIGS. 2, 3, and 4. The processing device then programs the current block according to the deck programming order determined in 610. In some embodiments, the processing device clears the buffer after each deck has been programmed. For example, after programming the deck with the highest defect severity, the processing device clears the user data from the buffer that was just written into the deck with the highest defect severity. The processing device then uses the buffer to store user data for the next deck to be programmed.

Figure 7:
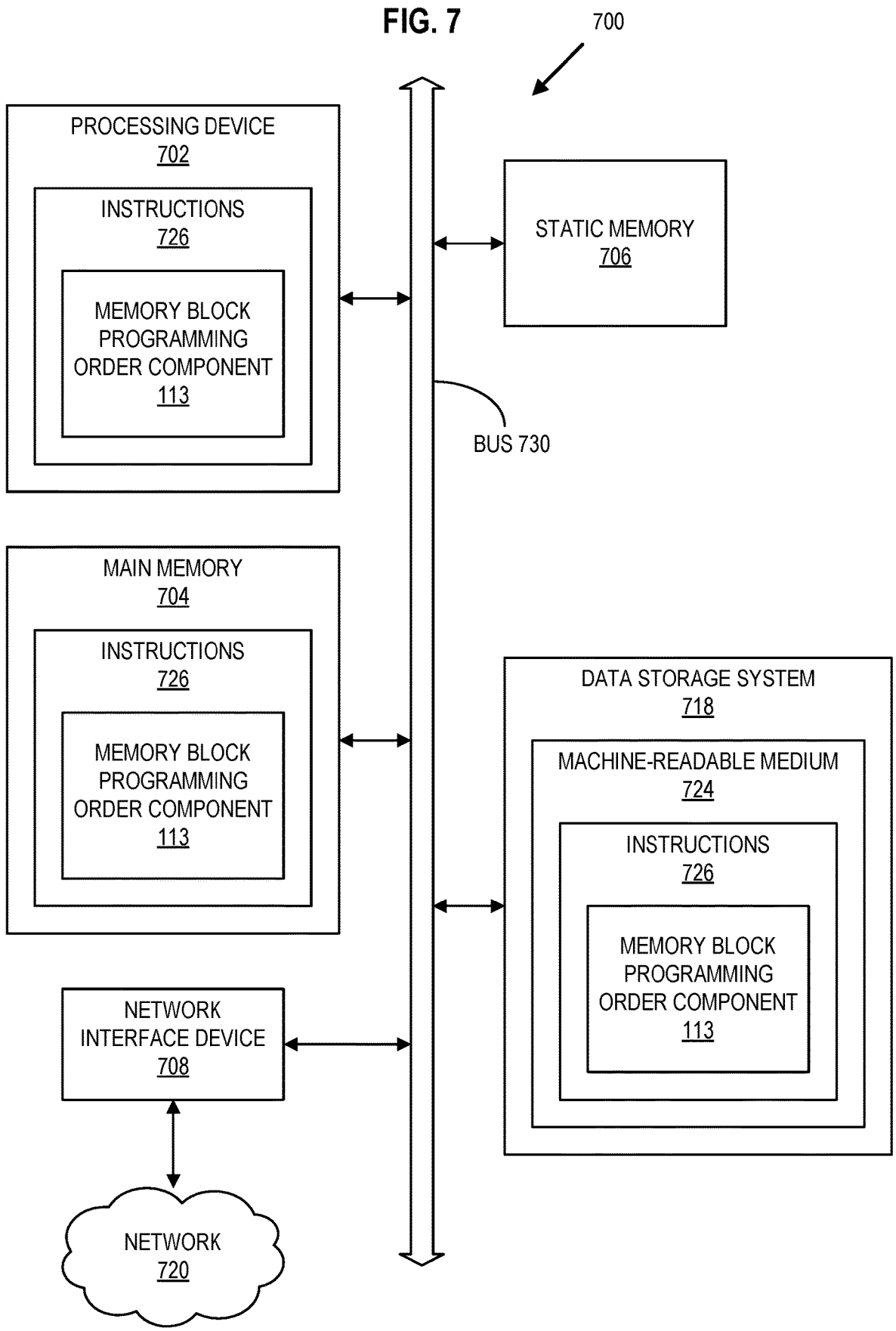
FIG. 7 is a block diagram of an example computer system in which embodiments of the present disclosure may operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the memory block programming order component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory subsystem 110 of FIG. 1.

In one embodiment, the instructions 726 include instructions to implement functionality corresponding to a memory block programming order component (e.g., the memory block programming order component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, may carry out the computer-implemented methods 500 and 600 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
retrieving a defectivity footprint of a portion of memory, the portion of memory composed of a plurality of blocks;
determining, based on the defectivity footprint, a deck programming order for a current block of the plurality of blocks wherein the current block is composed of a plurality of decks and wherein the deck programming order comprises an order in which the plurality of decks is programmed; and
programming the plurality of decks according to the determined deck programming order.

2. The method of claim 1, wherein each of the plurality of decks comprises a top side and a bottom side and wherein the deck programming order further comprises a direction in which each of the plurality of decks is programmed, the direction indicating whether each of the plurality of decks is programmed from the top side to the bottom side or the bottom side to the top side.

3. The method of claim 1, further comprising:
determining, for each of the plurality of decks, a defect severity based on the defectivity footprint, wherein the deck programming order is an order from a highest defect severity to a lowest defect severity.

4. The method of claim 3, wherein the defectivity footprint comprises locations of one or more defects and the defect severity for each of the one or more defects.

5. The method of claim 1, wherein the plurality of decks includes two decks, each deck comprising half of the current block.

6. The method of claim 1, further comprising:
updating the defectivity footprint based on program logs indicating areas of the portion of memory determined to be defective during operation of the portion of memory.

7. The method of claim 6, wherein the program logs comprise logs of locations of uncorrectable errors in the portion of memory.

8. A non-transitory computer-readable storage medium comprising instructions that, when executed by a processing device, cause the processing device to:
retrieve a defectivity footprint of a portion of memory, the portion of memory composed of a plurality of blocks;
determine, based on the defectivity footprint, a deck programming order for a current block of the plurality of blocks wherein the current block is composed of a plurality of decks and wherein the deck programming order comprises an order in which the plurality of decks is programmed; and
program the plurality of decks according to the determined deck programming order.

9. The non-transitory computer-readable storage medium of claim 8, wherein each of the plurality of decks comprises a top side and a bottom side and wherein the deck programming order further comprises a direction in which each of the plurality of decks is programmed, the direction indicating whether each of the plurality of decks is programmed from the top side to the bottom side or the bottom side to the top side.

10. The non-transitory computer-readable storage medium of claim 8, wherein the processing device is further to:
determine, for each of the plurality of decks, a defect severity based on the defectivity footprint, wherein the deck programming order is an order from a highest defect severity to a lowest defect severity.

11. The non-transitory computer-readable storage medium of claim 10, wherein the defectivity footprint comprises locations of one or more defects and the defect severity for each of the one or more defects.

12. The non-transitory computer-readable storage medium of claim 8, wherein the plurality of decks includes two decks, each deck comprising half of the current block.

13. The non-transitory computer-readable storage medium of claim 8, wherein the processor is further to:
update the defectivity footprint based on program logs indicating areas of the portion of memory determined to be defective during operation of the portion of memory.

14. The non-transitory computer-readable storage medium of claim 13, wherein the program logs comprise logs of locations of uncorrectable errors in the portion of memory.

15. A system comprising:
a plurality of memory devices; and
a processing device, operatively coupled with the plurality of memory devices, to:
retrieve a defectivity footprint of a portion of memory, the portion of memory composed of a plurality of blocks;
determine, based on the defectivity footprint, a deck programming order for a current block of the plurality of blocks wherein the current block is composed of a plurality of decks, wherein each of the plurality of decks comprises a top side and a bottom side, and wherein the deck programming order comprises an order in which the plurality of decks is programmed and a direction in which each of the plurality of decks is programmed, the direction indicating whether each of the plurality of decks is programmed from the top side to the bottom side or the bottom side to the top side; and
program the plurality of decks according to the determined deck programming order.

16. The system of claim 15, wherein the processing device is further to:
determine, for each of the plurality of decks, a defect severity based on the defectivity footprint, wherein the deck programming order is an order from a highest defect severity to a lowest defect severity.

17. The system of claim 16, wherein the defectivity footprint comprises locations of one or more defects and the defect severity for each of the one or more defects.

18. The system of claim 15, wherein the plurality of decks includes two decks, each deck comprising half of the current block.

19. The system of claim 15, wherein the processor is further to:
update the defectivity footprint based on program logs indicating areas of the portion of memory determined to be defective during operation of the portion of memory.

20. The system of claim 15, wherein the program logs comprise logs of locations of uncorrectable errors in the portion of memory.

* * * * *